(12) United States Patent
Shen

(10) Patent No.: US 9,746,505 B2
(45) Date of Patent: Aug. 29, 2017

(54) RADIO FREQUENCY ENERGY DETECTION

(71) Applicant: Silicon Laboratories Inc., Austin, TX (US)

(72) Inventor: David Huitse Shen, Saratoga, CA (US)

(73) Assignee: Silicon Laboratories, Inc., Austin, TX (US)

( * ) Notice: Subject to any disclaimer, the term of this patent is extended or adjusted under 35 U.S.C. 154(b) by 448 days.

(21) Appl. No.: 14/557,266

(22) Filed: Dec. 1, 2014

(65) Prior Publication Data

US 2016/0154039 A1    Jun. 2, 2016

(51) Int. Cl.
*H03F 3/45*     (2006.01)
*G01R 21/10*    (2006.01)

(52) U.S. Cl.
CPC ........ *G01R 21/10* (2013.01); *H03F 2200/451* (2013.01)

(58) Field of Classification Search
CPC ..... H04L 25/03057; H04L 2025/03369; H04L 2025/03503; H04L 25/063; H04L 25/497; H04L 7/0276; H04L 25/0272; H04L 25/028; H03F 3/45188; H03F 3/45179; H03F 2200/78; H03F 2203/45024; H03F 2203/45288
See application file for complete search history.

(56) References Cited

U.S. PATENT DOCUMENTS

| | | | | |
|---|---|---|---|---|
| 5,291,150 A | * | 3/1994 | Saarnimo | H03G 3/3042 327/332 |
| 5,796,309 A | * | 8/1998 | Nguyen | H03G 7/08 330/110 |
| 8,217,717 B1 | * | 7/2012 | Bui | G01R 21/10 330/140 |

* cited by examiner

*Primary Examiner* — Alesa Allgood
(74) *Attorney, Agent, or Firm* — Cesari & Reed, LLP; R. Michael Reed

(57) ABSTRACT

In an embodiment, an apparatus may include first input and a second input to receive a differential input signal and may include a diode including an anode coupled to the first input and including a cathode coupled to the second input. The apparatus may further include a feedback circuit having an input coupled to the cathode and an output coupled to the anode. The feedback circuit may be configured to apply a feedback signal to the diode to maintain a substantially constant direct current across the diode. The apparatus may also include a comparator coupled to the feedback circuit and configured to compare the feedback signal to a threshold to detect radio frequency energy in the input signal in response to changes in the feedback signal.

20 Claims, 4 Drawing Sheets

US 9,746,505 B2

1

RADIO FREQUENCY ENERGY DETECTION

FIELD

The present disclosure is generally related to radio frequency energy detection, and more particularly to differential radio frequency energy detection circuits.

BACKGROUND

In some circuits, a detector circuit may be used to determine a power level in a radio frequency signal. In some examples, the detector circuit can be used as a low power circuit which can wake up a system with a power in excess of a specified threshold is detected.

SUMMARY

In some embodiments, an apparatus may include first input and a second input to receive a differential input signal and may include a diode including an anode coupled to the first input and including a cathode coupled to the second input. The apparatus may further include a feedback circuit having an input coupled to the cathode and an output coupled to the anode. The feedback circuit may be configured to apply a feedback signal to the diode to maintain a substantially constant direct current across the diode. The apparatus may also include a comparator coupled to the feedback circuit and configured to compare the feedback signal to a threshold to detect radio frequency energy in the input signal in response to changes in the feedback signal.

In other embodiments, an apparatus may include a diode including an anode and a cathode, a first input coupled to the anode, and a second input coupled to the cathode. The apparatus may further include a feedback circuit including an input, an output, and a node. The input may be coupled to the cathode, and the output may be coupled to the anode. The apparatus may also include a comparator including a first input coupled to the node, a second input to receive a threshold voltage, and an output to provide a signal representative of radio frequency energy in an differential input signal at the first and second inputs based on a feedback signal of the feedback circuit.

In still other embodiments, a method may include coupling a differential input signal to an anode and a cathode of a diode. The method may further include providing a feedback signal to the anode of the diode based on a comparison of a voltage at the cathode of the diode to a reference voltage. The feedback signal may be configured to maintain a substantially constant direct current across the diode as the differential input signal varies. The method may also include providing an output signal indicating detection of radio frequency energy in the differential input signal when changes in the feedback signal exceed a threshold.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of circuits and methods are described below that may be used to perform energy detection using a single diode in a radio frequency (RF) signal path. In some embodiments, the circuits and methods may be used to detect energy in a differential RF input signal using a single diode in the RF signal path. In response to large signals, the detector circuit may operate as a peak detector, but at small signal levels, the diode functions as a non-linear circuit element capable of converting RF energy into direct current (DC) energy. In some embodiments, the circuits and methods may apply a differential RF input signal across the diode, taking advantage of the signal swings provided by the differential RF inputs. In some embodiments, the diode may be placed in DC feedback to maintain a constant DC current, and the diode may convert the RF input signal into a DC signal proportional to the differential input voltage. An operational amplifier in a feedback configuration may adjust its output voltage to reduce the DC current in the presence of an AC signal. The reduction in DC current may be compared against a threshold voltage to determine the presence of RF energy.

Figure 1A:
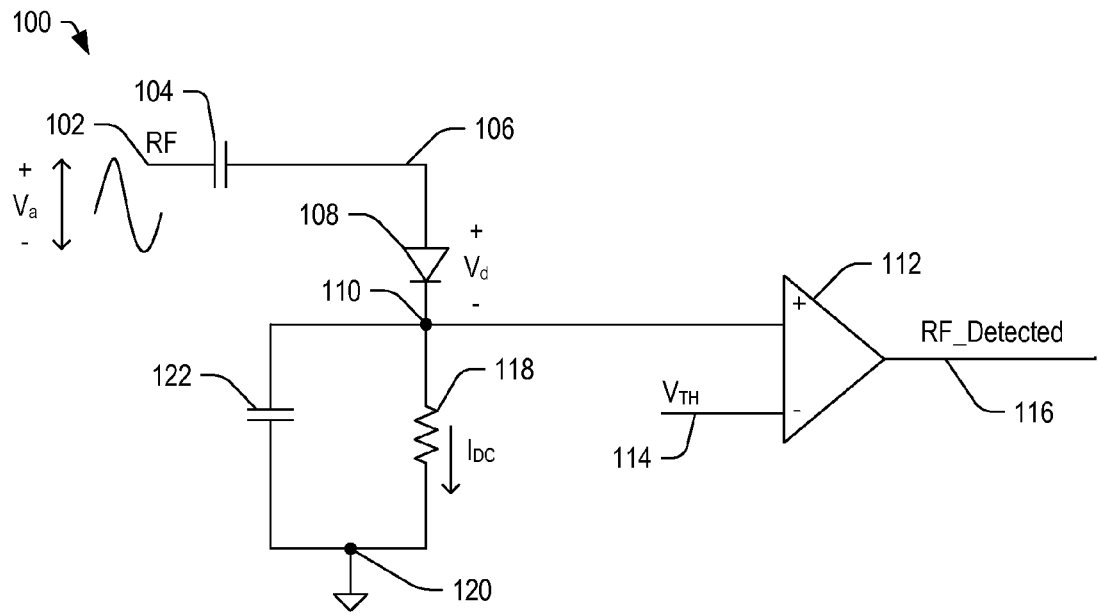
FIG. 1A is a diagram of a detector circuit, in accordance with certain embodiments.

FIG. 1A is a diagram of a detector circuit 100, in accordance with certain embodiments. The detector circuit 100 may include an input 102 configured to receive an RF signal. The detector circuit 100 may also include a capacitor 104 coupled between the input 102 and a node 106. The detector circuit 100 may further include a diode 108 in the RF signal path. The diode 108 includes an anode coupled to the node 106 and a cathode coupled to a node 110, which may be coupled to a first input of a differential amplifier 112. The differential amplifier 112 may include a second input 114 to receive a threshold voltage ($V_{TH}$), which may be programmable and which may be received from a voltage regulator, a voltage reference circuit, another voltage source, or any combination thereof. The differential amplifier 112 further includes an output 116 to provide an output signal, which may represent detection of radio frequency energy (RF_Detected).

The detector circuit 100 further includes a resistor 118 coupled between the node 110 and a node 120, which may be coupled to a power supply, such as ground. The detector circuit 100 may also include a capacitor 122 coupled between the node 110 and the node 120.

In some embodiments, a peak voltage of the RF input signal at the input 102 may be impressed on the capacitor 122, which is then used to sense the peak voltage at the node 110 via the differential amplifier 112 by comparing the voltage to the voltage threshold ($V_{TH}$). The non-linear behavior of the diode 108 converts the RF energy into DC energy according to the following equation.

$$V_d = V_0 + V_a \cos(Wt) \quad (1)$$

In Equation 1, the voltage across the diode 108 ($V_d$) is equal to the sum of the DC voltage ($V_0$) stored by the capacitor 122 and the input voltage defined by the sinusoidal function, where the variable ($V_a$) represents an amplitude of the sinusoidal function.

The initial current may be determined according to the Shockley ideal diode equation where the ideality factor is set to one as shown in the following equation.

$$I_0 = I_s \left( e^{\frac{V_d}{V_t}} - 1 \right) \quad (2)$$

In Equation 2, the ideal diode current ($I_0$) is equal to the reverse bias saturation current ($I_s$) times an exponential factor. The variable ($V_d$) represents the voltage across the diode, and the variable ($V_t$) represents the thermal voltage. Generally, the reverse saturation current ($I_s$) is not a constant, but rather may vary with temperature. The diode current ($I_d$) may be approximately equal to the ideal diode current according to the following equation.

$$I_d = I_s \left( e^{\frac{V_d}{V_t}} - 1 \right) \sim I_0 \left( e^{\frac{V_a \cos(wt)}{V_t}} \right) \quad (3)$$

Expansion of the diode current equation of Equation 3 produces the following equation.

$$I_d = I_0 + I_0 \left( \frac{V_d}{V_t} \right) + \frac{\left( \frac{V_d}{V_t} \right)^2}{2} + \frac{\left( \frac{V_d}{V_t} \right)^3}{6} \quad (4)$$

For diode voltages ($V_d$) that are significantly less than the thermal voltage ($V_t$), the diode current may be approximated according to the following equation.

$$I_d = \frac{I_0}{4} * \left( \frac{V_a}{V_t} \right)^2 \quad (5)$$

The square law function for small signals creates the DC component from the RF input amplitude independent of the diode area but dependent on the value of the DC current flowing through the diode, $I_0$.

In certain embodiments, the input 102 may be coupled to an input of a low noise amplifier (LNA), which may be in a low power mode along with other circuitry. When the LNA is in a low power mode or is off, the detector circuit 100 may be able to detect RF energy at the input of the LNA, and may communicate an RF detection signal to a control circuit, such as a microcontroller unit, a field programmable gate array (FPGA) circuit, a local oscillator control circuit, other circuitry, or any combination thereof. In response to the RF detection signal, the control circuit may alter the operating mode of the LNA and other circuitry to receive the RF signal.

Figure 1B:
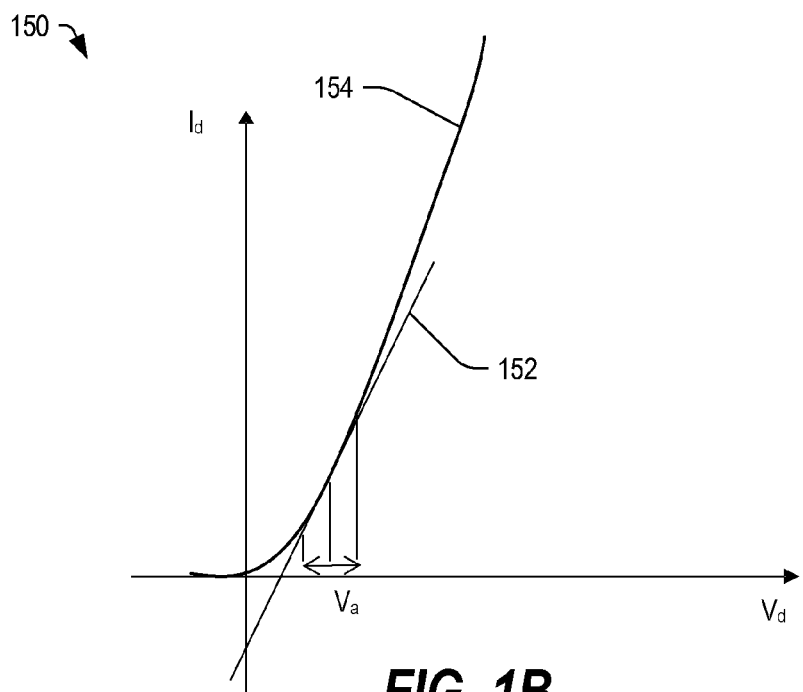
FIG. 1B is a graph of diode current versus diode voltage for a diode of the detector circuit of FIG. 1A, in accordance with certain embodiments.

FIG. 1B is a graph 150 of diode current versus diode voltage for a diode of the detector circuit of FIG. 1A, in accordance with certain embodiments. Across the range of the input signal amplitude ($V_a$), the diode current varies exponentially as indicated at 154, which is different from the linear approximation indicated at 152. The non-linear behavior of the diode 108 converts the RF energy into DC energy.

Figure 2:
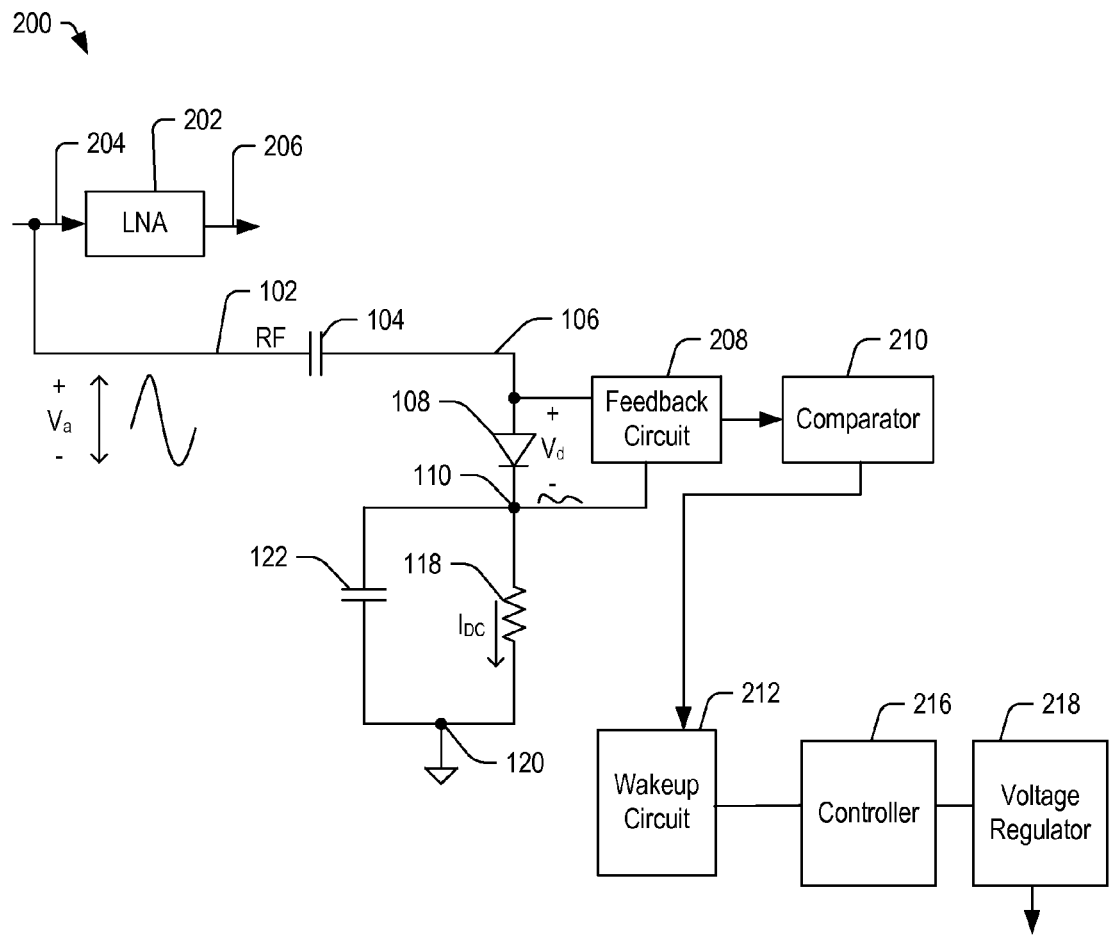
FIG. 2 is a partial circuit diagram and partial block diagram of a circuit that includes a detector circuit, in accordance with certain embodiments.

FIG. 2 is a partial circuit diagram and partial block diagram of a circuit 200 that includes a detector circuit, in accordance with certain embodiments. The circuit 200 may include all of the elements of the circuit 100 of FIG. 1A and includes a low noise amplifier (LNA) 202 including an input 204 to receive a signal and including an output to provide an amplified version of the signal. The input 102 may be coupled to the input 204 of the LNA 202 to receive the signal. Further, the circuit 200 may include a feedback circuit 208 (or feedback loop) having an input coupled to the cathode of the diode 108 and having an output coupled to the anode of the diode 108. In some embodiments, the feedback circuit may be configured to maintain a substantially constant current across the diode 110 as the input signal varies.

The circuit 200 may also include a comparator 210 including an input coupled to a node within the feedback circuit 208 and including an output coupled to a wakeup circuit 212. The comparator 210 may include a second input (not shown) to receive a threshold voltage to which a voltage of the node of the feedback circuit may be compared to produce an output signal. The circuit 200 may further include a local oscillator circuit 214 having an input coupled to the wakeup circuit 212 and an output coupled to a controller 216, which may be coupled to a voltage regulator 218 or other circuitry. In some embodiments, the controller 216 may include a microcontroller unit (MCU), an FPGA circuit, a processor, another circuit, or any combination thereof.

In some embodiments, the feedback circuit 208 may provide a feedback signal to the anode of the diode 108 based on the voltage at the node 110, while other circuitry may be in a low-power mode or may be turned off to reduce power consumption. The comparator 210 may detect RF energy in the input signal based on changes in the feedback signal and may provide a signal representative of the RF energy to the wakeup circuit 212 in response to the detection. The wakeup circuit 212 may enable the local oscillator 214 to provide a clock signal to the controller 216. In response to the clock signal, the controller 216 may wake up and enable the voltage regulator 218 to supply power to various circuits, including the LNA 202 and other circuitry. In response to the applied power, the circuitry may change from a low power mode to a normal operating mode to process the received signal at the input 204.

In some embodiments, the wakeup circuit 212 may include a method to determine the amount of time that the detected energy exceeds the threshold. In some embodiments, when the received energy reaches a threshold level, a capacitor may be configured to accumulate charge or alternatively to activate a timer to determine the amount of time that the energy is present (i.e., the received energy exceeds the threshold level). When the amount of time that energy is present exceeds a threshold period, the wakeup circuit 212 may provide an output signal, which can be used to activate the controller 216 to determine or alter the state of the system.

It should be appreciated that the embodiments of the detector circuits of FIGS. 1A and 2 are single input circuits, which are not configured to receive differential signals. However, the single diode concept may be extended to operate with differential inputs to provide energy detection with low power consumption. One possible implementation of a differential input detector circuit using a single diode is described below with respect to FIG. 3.

Figure 3:
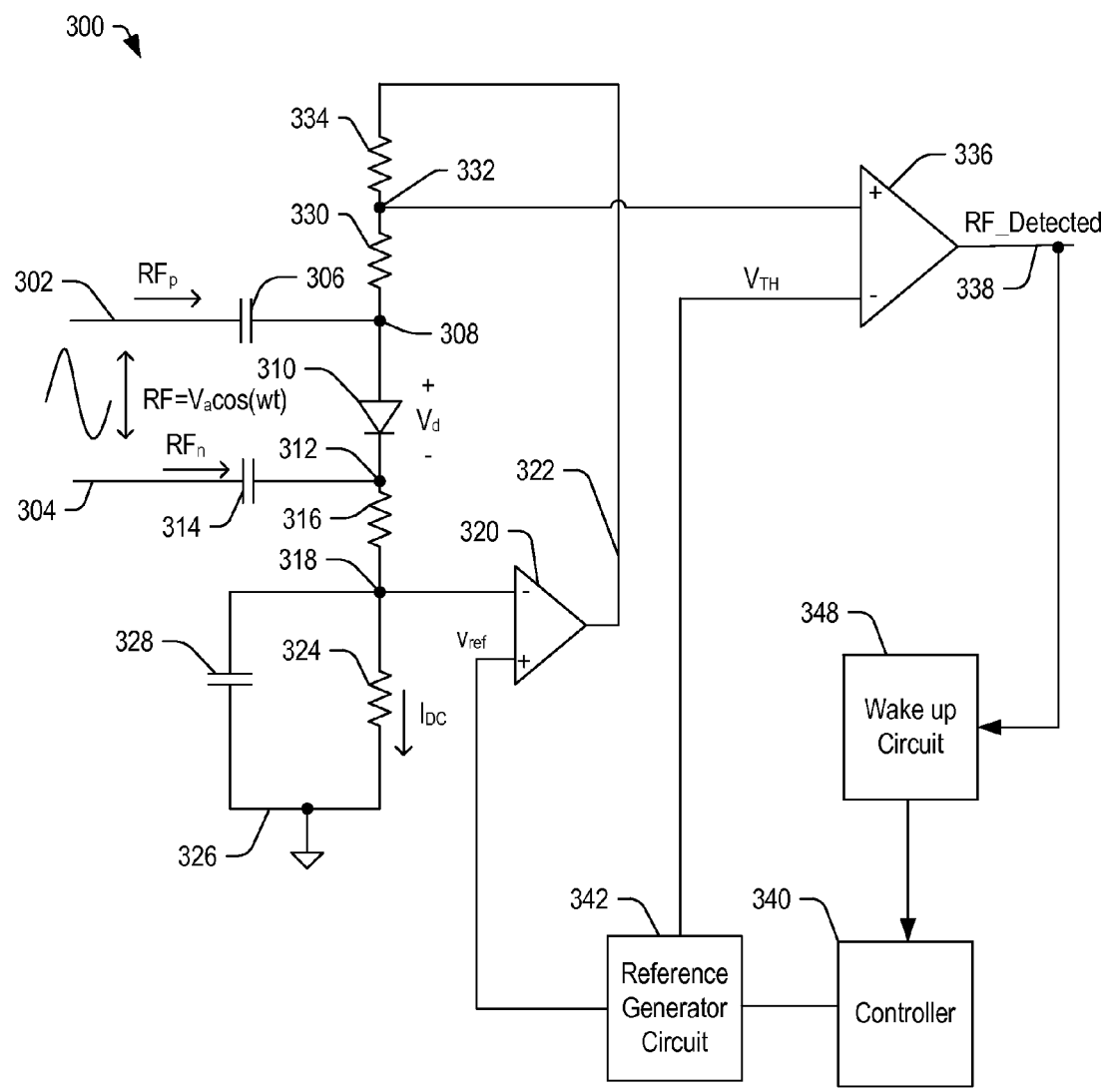
FIG. 3 is a circuit diagram of a differential input diode detector circuit, in accordance with certain embodiments.

FIG. 3 is a circuit diagram of a differential input diode detector circuit 300, in accordance with certain embodiments. The circuit 300 may include a first input 302 and a second input 304 to receive a radio frequency signal, which may be a sinusoidal signal. The circuit 300 may include a capacitor 306 coupled between the first input 302 and a node 308. The circuit 300 may further include a capacitor 314 coupled between the second input 304 and a node 312. The capacitors 306 and 314 may block DC current flow and may operate as a high pass filter for the high frequency components of the RF signal to pass through.

The circuit 300 may include a diode 310 having an anode coupled to the node 308 and a cathode coupled to the node 312. The circuit 300 may further include a resistor 316 coupled between the node 312 and a node 318. The circuit 300 may further include a differential amplifier 320 include a negative input couple to the node 318, a positive input to receive a reference voltage ($V_{ref}$), and an output coupled to a node 322. The circuit 300 may include a resistor 324 coupled between the node 318 and a node 326, which may be coupled to a power supply, such as ground. Further, the circuit 300 may include a capacitor 328 coupled between the node 318 and the node 326.

The circuit 300 may include a resistor 330 coupled between the node 308 and a node 332, and may include a resistor 334 coupled between the node 332 and the node 322. The node 332 may be coupled to a positive input of a differential amplifier 336, which has a second input to receive a threshold voltage ($V_{TH}$) and an output 338 to provide an output signal (labeled "RF_Detected"). In some embodiments, the resistor 330 and the resistor 334 may be selected to provide a desired resistive divider circuit. In some embodiments, the resistor 330 and the resistor 334 may be variable resistors that can have programmable resistances to provide the desired resistive divider circuit.

In some embodiments, the circuit 300 may include a controller 340 coupled to a reference generator circuit 342, which may program the reference voltage ($V_{ref}$) at the positive input of the differential amplifier 320 and which may independently program the threshold voltage ($V_{TH}$) at the negative input of the differential amplifier 336. In some embodiments, the controller 342 may include a microcontroller unit (MCU), an FPGA circuit, a processor, another circuit, or any combination thereof. The circuit 300 may include a latch circuit 344 coupled between the reference generator circuit 342 and the positive input of the differential amplifier 320. In some embodiments, the controller 340 and the reference generator 342 may be placed in a low-power mode, reducing their power consumption, during idle periods, such as when no RF signals are being received. The circuit 300 may include a wakeup circuit 348 coupled to the output node 338 and to the controller 340. The wakeup circuit 348 may be configured to generate a wakeup signal (such as a local oscillator signal or other signal) in response to an RF_Detected signal at the output 338 and may provide the wakeup signal to the controller 340, which may cause other circuits to leave the low power mode and to enter a normal operating mode.

In some embodiments, a differential signal may be received at the inputs 302 and 304, and the high frequency components of the signal may be provided to the nodes 308 and 312. The diode 310 may convert the RF energy from the differential signal into a DC voltage. The diode 310, in the illustrated configuration, is placed in DC feedback via the node 322 and the resistors 334 and 330 to maintain a constant DC current across the diode 310. The RF input signal components circulate through the diode 310 and are converted to a DC signal proportional to the input voltage ($RF_p$–$RF_n$). The diode 310 maintains the DC current as a constant because of the DC feedback configuration. As a result, the operational amplifier 320 in the feedback loop (feedback circuit that includes the amplifier 320 and resistors 330 and 334) may adjust its output signal (feedback signal) at the node 322 to reduce the DC voltage across the diode 310 in the presence of an AC signal (DC signal converted from the RF signals by the diode 310). The DC voltage across the diode 310 is reduced in response to the AC-to-DC current conversion, which is occurring due to the non-linear behavior of the diode while maintaining a constant DC current between its anode and cathode. The changes in DC voltage across the diode 310 are translated to a voltage change at the node 332, which voltage can be compared against a threshold voltage ($V_{TH}$) by the differential amplifier 336 to sense the presence of RF energy in the input signal at inputs 302 and 304.

In some embodiments, the threshold voltage ($V_{TH}$) for energy detection can be programmable by changing the voltage at the negative input of the differential amplifier 336. In some embodiments, the energy detection circuit may be changed by altering the value of the resistors in series with the diode 310, such as one or more of the resistors 334, 330, 316, and 324. In addition to the ease with which the energy detection thresholds may be adjusted, another advantage is that the amplifier 336 can be implemented as a relatively slow circuit because the RF energy only appears across the diode 310 and not across the amplifier 336 or the amplifier 320.

In some embodiments, the RF energy of the input signal at the inputs 302 and 304 are applied across the diode 310 (i.e., to the anode and the cathode of the diode 310). The resistors 334, 330, and 316 isolate the diode 310 from the feedback node 318 and the RF energy detection node 332. The diode 310, the amplifier 320, and the resistors 316, 334, and 330 cooperate to provide a low pass filter functionality to convert high frequency signal components into a DC component. Further, the feedback loop or circuit provided by the amplifier 320, the resistor 334, and the resistor 330 allow for detection of the RF energy (or current) in feedback, which allows for greater sensitivity in the detection with less power consumption.

In some embodiments, the detector circuit 300 may be employed in conjunction with a larger circuit that includes a low power operating mode in which power is turned off or reduced for at least some of the circuitry during periods where the circuit is not receiving RF signals. The detector circuit 300 may detect RF energy at the inputs when the rest of the circuit is in a low-power state and may provide a wakeup signal in response to detection of the RF energy, which wakeup signal may cause the controller 340 or another circuit to change its state (such as by enabling a local oscillator to provide a local clock signal), which may cause other circuits to enter a different operating state, such as a normal operating mode, within which mode the circuitry may consume more power than the low power state.

Figure 4:
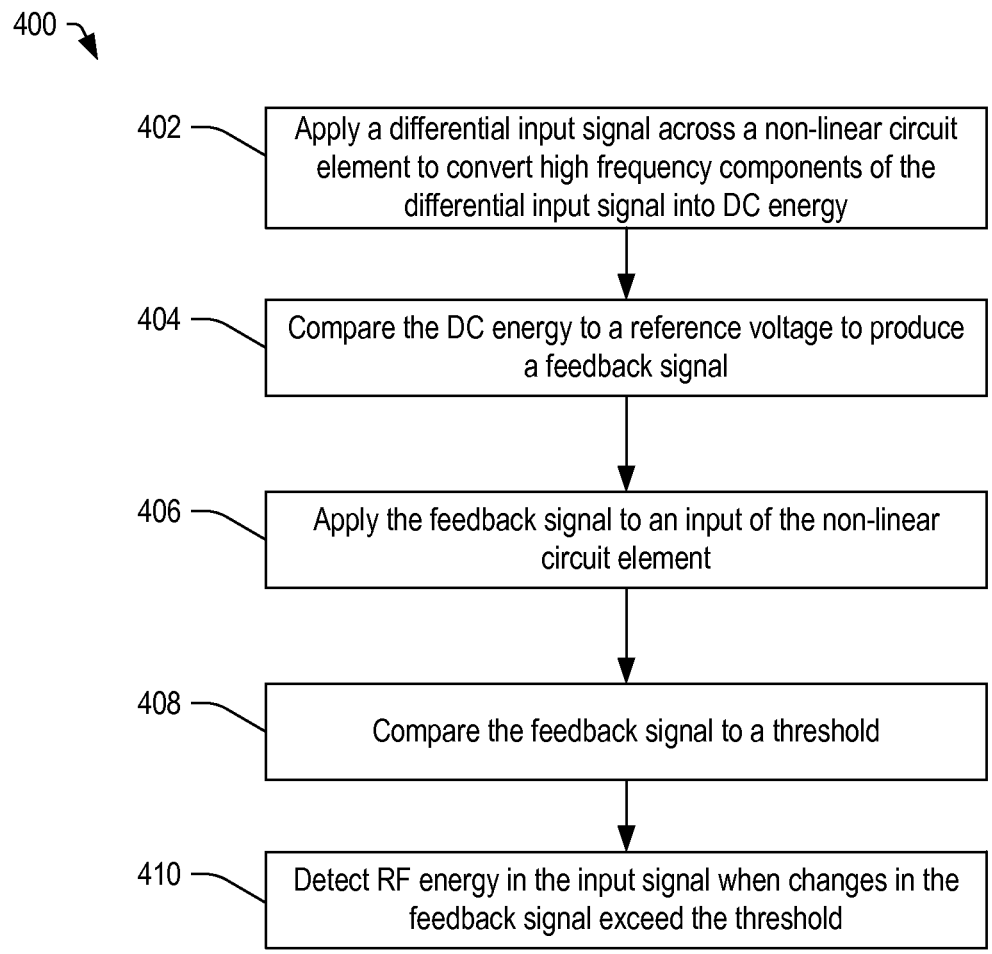
FIG. 4 is a flow diagram of an embodiment of a method of detecting energy in an input signal, in accordance with certain embodiments.

FIG. 4 is a flow diagram of an embodiment of a method 400 of detecting energy in an input signal, in accordance with certain embodiments. At 402, a differential input signal is applied across a non-linear circuit element to convert high frequency components of the differential input signal into DC energy. In some embodiments, the non-linear circuit element may be a diode, a diode-connected transistor, another P-N junction device, or another non-linear circuit element that may be configured to convert small signal energy into a DC current.

Advancing to 404, the DC energy is compared to a reference voltage to produce a feedback signal. In some embodiments, the reference voltage may be programmed or configured at a selected voltage level. In some embodiments, the reference voltage and a DC voltage derived from the DC current may be compared using a differential amplifier.

Continuing to 406, the feedback signal is applied to an input of the non-linear circuit component. In some embodiments, the feedback signal may be provided to the non-linear circuit component through one or more isolating circuit elements, such as resistors.

Moving to 408, the feedback signal is compared to a threshold. In some embodiments, a differential amplifier receives a voltage derived from the feedback signal at a positive input, receives a threshold voltage at a negative input, and produces an output signal corresponding to the detected changes in the feedback signal. Continuing to 410, RF energy is detected in the input signal when changes in the feedback signal exceed the threshold.

In some embodiments, a feedback amplifier, such as the differential amplifier 320, may produce an output signal to adjust a voltage applied to the non-linear circuit element, such that the current across the non-linear circuit element remains substantially constant even as the RF input signal across the non-linear circuit element varies. Thus, the feedback signal at the output of the differential amplifier 320 may represent the variations in the RF input signal, which allows the amplifier 336 to detect the small signal components of the RF input signal from the DC changes in the feedback signal.

In some embodiments, since the RF energy from the input signal only appears across the non-linear circuit element, such as the diode 310, and is not applied across the amplifier, the amplifiers 320 and 336 may be relatively slow circuits, allowing for lower power and lower cost circuit components. Further, the reference voltage level and threshold voltage level can be programmed. In a particular example, the threshold voltage and the reference voltage may be controlled using a reference generator circuit 342 and stored using a capacitor, or other charge storage element to provide a desired signal level for comparison. In some embodiments, the value of one or more resistors in series may be selected or adjusted to change the voltage divider used to gauge changes in the feedback signal.

In conjunction with circuits and methods described above with respect to FIGS. 1-4, an input signal may be applied across a non-linear resistive element (such as a diode) and a feedback loop may be coupled to the diode to maintain a substantially constant DC current across the diode. A comparator circuit may be coupled to the feedback loop to detect changes in a feedback signal, which changes may represent RF energy in the input signal. In some embodiments, the circuit may detect such RF energy when the changes in the feedback signal exceed a programmable voltage threshold. In some embodiments, in response to detecting such RF energy in the input signal, the circuit may provide an output signal that may be provided to another circuit in order to initiate a change in operating modes, such as a change from a low-power mode (sleep or idle mode) to a normal operating power mode.

Although the present invention has been described with reference to preferred embodiments, workers skilled in the art will recognize that changes may be made in form and detail without departing from the scope of the invention.

What is claimed is:

1. An apparatus comprising:
a first input and a second input to receive a differential input signal;
a diode including an anode coupled to the first input and including a cathode coupled to the second input;
a feedback circuit having an input coupled to the cathode and an output coupled to the anode, the feedback circuit configured to apply a feedback signal to the diode to maintain a substantially constant direct current across the diode; and
a comparator coupled to the feedback circuit and configured to compare the feedback signal to a threshold to detect radio frequency energy in the input signal in response to changes in the feedback signal.

2. The apparatus of claim 1, wherein the feedback circuit comprises:
an amplifier including a first input, a second input configured to receive a reference voltage, and an output to provide the feedback signal;
a first resistor coupled between the output of the amplifier and a node;
a second resistor coupled between the node and the anode of the diode;
a third resistor coupled between the cathode of the diode and the first input of the amplifier; and
wherein the comparator is coupled to the node.

3. The apparatus of claim 2, wherein the reference voltage is programmable.

4. The apparatus of claim 2, wherein at least one of the first resistor and the second resistor and the third resistor has an adjustable resistance.

5. The apparatus of claim 4, wherein the third resistor is coupled to a filter, wherein the filter comprises:
at least one resistor; and
at least one capacitor.

6. The apparatus of claim 2, wherein the comparator comprises:
a first input coupled to the node;
a second input configured to receive a threshold voltage; and
an output to provide an RF energy detection signal representing RF energy in the input signal when the feedback signal exceeds the threshold voltage.

7. The apparatus of claim 6, wherein the threshold voltage is adjustable.

8. An apparatus comprising:
a diode including an anode and a cathode;
a first input coupled to the anode;
a second input coupled to the cathode;
a feedback circuit including an input, an output, and a node, the input coupled to the cathode, the output coupled to the anode; and
a comparator including a first input coupled to the node, a second input to receive a threshold voltage, and an output to provide a signal representative of radio frequency energy in an differential input signal at the first and second inputs based on a feedback signal of the feedback circuit.

9. The apparatus of claim 8, wherein the feedback circuit is configured to apply the feedback signal to the diode to maintain a substantially constant direct current across the diode as the differential input signal varies.

10. The apparatus of claim 8, wherein the comparator comprises an amplifier including:
a first input coupled to the node of the feedback circuit;
a second input configured to receive a threshold voltage; and
an output to provide the signal representative of radio frequency energy in the differential input signal.

11. The apparatus of claim 8, further comprising a wakeup circuit coupled to the output of the comparator, the wakeup circuit configured to enable operation of one or more circuits in response to the signal indicating detection of radio frequency energy in the differential input signal.

12. The apparatus of claim 8, wherein the feedback circuit comprises:
an amplifier including a first input, a second input configured to receive a reference voltage, and an output to provide the feedback signal;
a first resistor coupled between the output of the amplifier and a second node;
a second resistor coupled between the second node and the anode of the diode;
a third resistor coupled between the cathode and the first input of the amplifier and the cathode.

13. The apparatus of claim 12, wherein at least one of the first resistor and the second resistor and the third resistor has an adjustable resistance.

14. The apparatus of claim 12, wherein the third resistor is coupled to a filter, wherein the filter may include at least one resistor and at least one capacitor.

15. The apparatus of claim 8, wherein the feedback circuit provides a feedback signal to the anode of the diode to maintain a substantially constant current across the diode as the differential input signal varies.

16. The apparatus of claim 15, wherein the comparator detects the radio frequency energy in the differential input signal based on changes in the feedback signal.

17. A method comprising:
coupling a differential input signal to an anode and a cathode of a diode;
providing a feedback signal to the anode of the diode based on a comparison of a voltage at the cathode of the diode to a reference voltage, the feedback signal configured to maintain a substantially constant direct current across the diode as the differential input signal varies; and
providing an output signal indicating detection of radio frequency energy in the differential input signal when changes in the feedback signal exceed a threshold.

18. The method of claim 17, wherein providing the feedback signal comprises:
comparing a voltage at the cathode of the diode at a first input of an amplifier to a reference voltage at a second input of the amplifier to produce the feedback signal; and
converting the feedback signal to a voltage at a node coupled to an input of a second amplifier and coupled to the anode of the diode.

19. The method of claim 17, wherein providing the output signal comprises:
comparing a voltage derived from the feedback signal at a first input of an amplifier to a threshold voltage at a second input of the amplifier to produce the output signal at an output of the amplifier.

20. The method of claim 19, further comprising providing the output signal to a wakeup circuit configured to cause one or more circuits to change from a low power mode to a second power mode.

* * * * *